US010145870B2

(12) United States Patent
Delplanque

(10) Patent No.: US 10,145,870 B2
(45) Date of Patent: Dec. 4, 2018

(54) METHOD AND SYSTEM FOR DETERMINING THE DYNAMIC CONSUMPTION OF A MODULE WITHIN AN ELECTRONIC DEVICE SUCH AS A SYSTEM ON CHIP

(71) Applicant: STMicroelectronics SA, Montrouge (FR)

(72) Inventor: Bruno Delplanque, Chaville (FR)

(73) Assignee: STMicroelectronics SA, Montrouge (FR)

( * ) Notice: Subject to any disclaimer, the term of this patent is extended or adjusted under 35 U.S.C. 154(b) by 192 days.

(21) Appl. No.: 15/357,244

(22) Filed: Nov. 21, 2016

(65) Prior Publication Data

US 2017/0356938 A1    Dec. 14, 2017

(30) Foreign Application Priority Data

Jun. 10, 2016   (FR) ..................... 16 55364

(51) Int. Cl.
*G01R 11/63* (2006.01)
*G01R 22/10* (2006.01)
(Continued)

(52) U.S. Cl.
CPC ....... *G01R 22/10* (2013.01); *G01R 31/31721* (2013.01); *G01R 31/31727* (2013.01);
(Continued)

(58) Field of Classification Search
CPC ...... G06F 1/3296; G06F 1/324; G06F 1/3287; G06F 1/28; G06F 1/32; G06F 1/3203; G06F 11/25; G06F 11/3055; G06F 11/3409; G06F 1/08; G06F 1/3293; G06F 2201/88; H02J 3/46; H02J 50/00; G01R 31/008; G01R 21/133; G01R 22/10; G01R 29/26; G01R 31/31721; G01R 31/31725;
(Continued)

(56) References Cited

U.S. PATENT DOCUMENTS 7,421,605 B2 *   9/2008   Balasubramanian ...................... H03K 17/687 713/300
8,689,023 B2 *   4/2014   Gupta ..................... G05F 1/575 713/300

(Continued)

OTHER PUBLICATIONS

INPI Search Report and Written Opinion for FR 1655364 dated Feb. 15, 2017 (7 pages).

(Continued)

*Primary Examiner* — Vinh Nguyen
(74) *Attorney, Agent, or Firm* — Crowe & Dunlevy

(57) ABSTRACT

A reference clock signal of at least one module clock signal associated with each module is delivered. A measurement period is generated and a module whose consumption is to be determined is selected. The frequency of the at least one module clock signal associated with the selected module reduced during the measurement period. A measurement of a first consumption of the device is made in the measurement period. A measurement of a second consumption of the device is made outside the measurement period. The consumption of the selected module is determined from the first and measured first and second consumptions.

14 Claims, 2 Drawing Sheets

(51) Int. Cl.
*G01R 31/317* (2006.01)
*G06F 1/32* (2006.01)
*H04L 7/00* (2006.01)
*G01R 21/133* (2006.01)

(52) U.S. Cl.
CPC ............ *G06F 1/324* (2013.01); *G01R 21/133* (2013.01); *H04L 7/0008* (2013.01)

(58) Field of Classification Search
CPC ... G01R 31/31727; G05F 1/468; G05F 1/462; G05F 1/613
See application file for complete search history.

(56) References Cited

U.S. PATENT DOCUMENTS

| 8,868,956 B1 * | 10/2014 | Kraipak | ................... G06F 1/26 713/340 |
| 8,909,948 B2 * | 12/2014 | Bansal | ..................... G06F 1/26 323/318 |
| 2014/0089697 A1 | 3/2014 | Kim et al. | |
| 2015/0212152 A1 | 7/2015 | Agarwal et al. | |

OTHER PUBLICATIONS

Prasadh, Ram N., et al: "Measurement of Current and Power Consumption in the Order of Milli-Watt Resolution in Processor Core Level," 2014 International Conference on Circuit, Power and Computing Technologies (ICCPCT), pp. 1733-1736.
Chang, Xiaotao, et al: "Adaptive Clock Gating Technique for Low Power IP Core in SoC Design," 2007 IEEE, pp. 2120-2123.

* cited by examiner

METHOD AND SYSTEM FOR DETERMINING THE DYNAMIC CONSUMPTION OF A MODULE WITHIN AN ELECTRONIC DEVICE SUCH AS A SYSTEM ON CHIP

PRIORITY CLAIM

This application claims the priority benefit of French Application for Patent No. 1655364, filed on Jun. 10, 2016, the disclosure of which is hereby incorporated by reference.

TECHNICAL FIELD

Implementations and embodiments concern electronic systems, notably systems on chip, commonly known to the person skilled in the art under the acronym SOC, comprising functional modules (subsystems) which are generally reusable in another system on chip and designated by the person skilled in the art as Intellectual Property Cores (IP Cores), and more particularly the determination of the individual consumption of these functional modules.

BACKGROUND

In general, there are various tools and/or methods for estimating a consumption of such a functional module within a system on chip.

In this regard, dedicated software may be used for eliminating the consumption of other functional modules. However, other structural elements of the system on chip remain functional, which generates errors of measurement and disparities between the estimate of the consumption and the dynamic consumption of the module considered.

Thus, according to one implementation and embodiment, a low cost and low complexity technical solution is provided for measuring in an actual case a dynamic consumption of an Intellectual Property Core within an electronic system, notably a system on chip.

SUMMARY

According to one aspect, a method is provided for determining the consumption of a module within a device, e.g. a system on chip, including: a delivery from a reference clock signal of at least one module clock signal associated with each module of the device, a generation of a measurement period, a selection of a module for measuring its consumption, a reduction in frequency of said at least one module clock signal associated with said selected module during said period, a first measurement of a first consumption of the device and a second measurement of a second consumption of said device respectively in said period and outside said period, and a determination of the consumption of the selected module according to the results of the measurements.

Although it is not absolutely essential, it is preferable, for reasons of synchronization, that the generation of the measurement period comprises a generation, for example, from an activation signal, of a pulse signal defining said measurement period and a generation of a synchronization signal for synchronizing the first measurement of the first consumption in said measurement period.

Said selection of said module whereof the consumption is to be determined may, for example, include a delivery, from a control signal and said pulse signal, of at least one selection signal associated with each module and intended to determine said reduction in frequency.

According to one implementation, said reduction in frequency includes a total frequency cut-off of said at least one module clock signal associated with said selected module during said period.

When a total frequency cut-off is performed, said determination of the consumption of the selected module may, for example, include a calculation of a difference between said first consumption and the second consumption. Said difference advantageously enables it alone to reproduce the dynamic consumption of said selected module in an actual case of operation.

When a simple reduction in frequency is performed, said determination of the consumption of the selected module may further include a multiplication of said difference between said first consumption and the second consumption by a coefficient taking into account the frequency reduction factor.

In this case, said difference corresponds to the variation in the dynamic consumption of said selected module during said period. And the multiplication of said difference then enables the dynamic consumption of said selected module to be reproduced in an actual case of operation.

According to another aspect, an electronic system is provided, including: a device (e.g. a system on chip) comprising multiple modules, control means configured for generating a measurement period and for selecting a module whereof the consumption is to be determined, sequencing means configured for delivering from a reference clock signal at least one module clock signal associated with the selected module and for performing a reduction in frequency of said at least one module clock signal associated with said selected module during said period, measurement means configured for performing a first measurement of a first consumption of said device and a second measurement of a second consumption of said device respectively in said period and outside said period, and calculation means configured for determining the dynamic consumption of said selected module according to the results of the measurements.

According to a preferred embodiment, the control means include a management means configured for delivering a control signal and an activation signal, and a pulse generator intended to receive said activation signal and to deliver a pulse signal defining said measurement period, said device further including an interface means configured for receiving said pulse signal and for delivering a synchronization signal enabling the measurement means to synchronize the first measurement of the first consumption in said measurement period.

According to one embodiment, the control means further include a selection means configured for receiving said control signal and said pulse signal so as to deliver to said sequencing means at least one selection signal associated with each module.

Advantageously, the sequencing means may comprise as many processing components as module clock signals. Each processing component is coupled to a corresponding module and intended to receive a corresponding selection signal originating from said control means and to deliver the module clock signal associated with said module.

Furthermore, the selection means may be configured for performing an automatic scan of the processing components so as to determine the dynamic consumption of each corresponding module.

When a total frequency cut-off is performed, the control means may be configured for delivering a clock cut-off signal to said sequencing means so as to perform a total frequency cut-off of said at least one module clock signal associated with said selected module during said period.

In this case, the calculation means may be configured for performing only one calculation of a difference between the first consumption and the second consumption.

When a reduction in frequency is simply performed, the calculation means may further be configured for performing a multiplication of said difference by a coefficient taking into account the frequency reduction factor.

BRIEF DESCRIPTION OF THE DRAWINGS

Other advantages and features of the invention will appear on examination of the detailed description of embodiments, in no way restrictive, and the accompanying drawings in which.

DETAILED DESCRIPTION OF THE DRAWINGS

Figure 1:
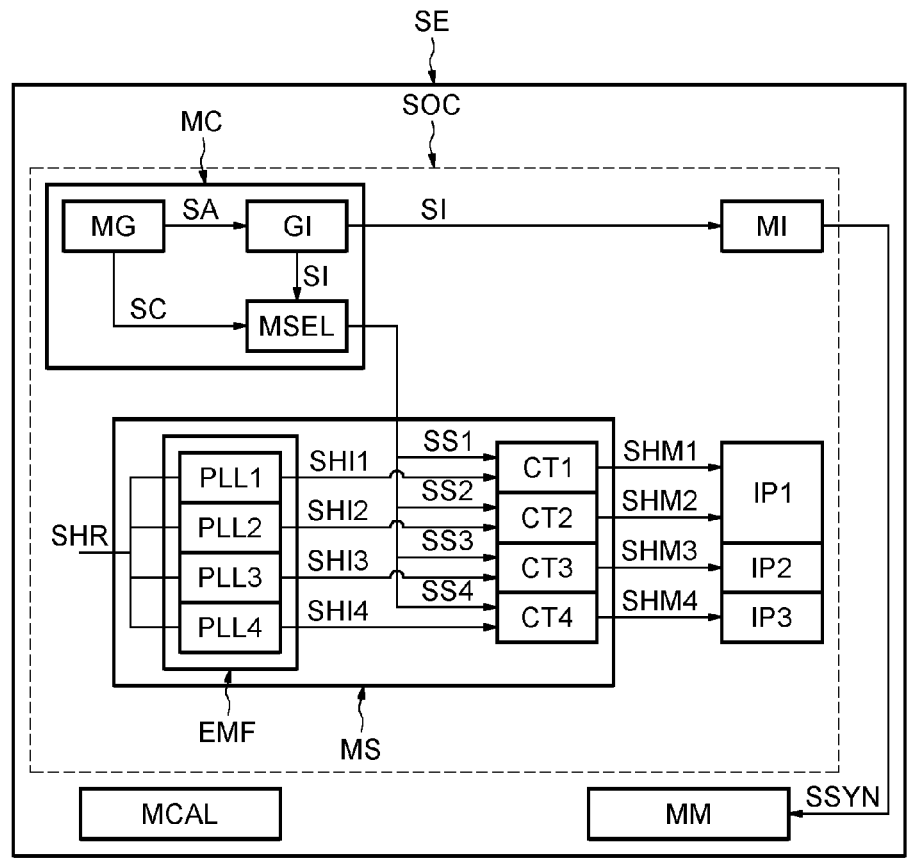
FIG. 1 schematically depicts one example of an electronic system.

FIG. 1 schematically depicts one example of an electronic system SE here comprising a device, e.g. a System on Chip SOC.

Said system SOC comprises a plurality of functional modules IPi, here, for example, three intellectual property cores IP1 to IP3, intended to fulfill various functionalities such as signal processing, image processing, etc.

Said system SOC further includes sequencing means MS comprising a frequency modifying stage EMF possessing multiple phase lock loops, here, for example, four loops PLL1 to PLL4, coupled in parallel and intended to multiply the frequency of a reference clock signal SHR received at their common input for delivering intermediate clock signals SHI1 to SHI4.

The sequencing means MS also comprise multiple processing components CT1 to CT4 coupled respectively to the phase lock loops PLL1 to PLL4 and configured for generating at least one module clock signal SHMi for each corresponding functional module IPi. Each module may have one or more module clock signals (here, for example, the first module IP1 possessing two module clock signals, a main clock signal SHM1 and a secondary clock signal SHM2).

The system SOC also includes control means MC comprising a management means MG, a pulse generator GI and a selection means MSEL.

The management means MG, here, for example, a power management processor, is configured for delivering a control signal SC, e.g. a programming link, intended to control a selection of a module IPi whose consumption is to be measured, and for delivering an activation signal SA to said pulse generator.

The pulse generator GI receives said activation signal SA and is intended to deliver a pulse signal SI defining a measurement period to an interface means MI, here, for example, an input/output port dedicated to a general use (General Purpose Input/Output: GPIO), of the system on chip SOC. Said pulse signal SI may, for example, be periodic or intermittent.

Said interface means MI is configured for generating a synchronization signal SSYN enabling the measurement means MM to synchronize said first measurement of the first consumption of the system SOC in said measurement period.

The selection means MSEL, performed, for example, by a logic circuit, receives said control signal SC and said pulse signal SI so as to deliver a corresponding selection signal SS1 to SS4 to each processing component CT1 to CT4. Each selection signal SSi is configured for controlling the corresponding processing component CTi so as to choose to deliver a functional frequency or a reduced frequency or even a total frequency cut-off to the associated module IPi.

It should be noted that said selection means MSEL is further configured for performing an optional automatic scan of the processing components CT1 to CT4 in order to know the dynamic consumption of the module IPi corresponding to each processing component CTi.

Moreover, references MM and MCAL respectively designate measurement means MM and calculation means MCAL of said electronic system SE.

The measurement means MM and the calculation means MCAL may generally be implemented outside said system on chip SOC as separate components (FIG. 1) for performing laboratory measurements, for example, or in special cases be incorporated in said system on chip SOC for performing embedded measurements, for example. The measurement MM and calculation MCAL means are of conventional structure and known per se.

The measurement means MM comprise a circuit or device configured for measuring the consumption of all or part of said system on chip SOC in real time. The measurement means MM are configured notably for performing a first measurement of a first consumption of the system SOC and a second measurement of a second consumption of the system SOC respectively in said measurement period and outside said measurement period.

The calculation means MCAL comprise a circuit or device configured for performing a calculation based on the measurement of the first consumption and the second consumption. More particularly, said calculation includes, for example, a calculation of a difference between the first and the second consumption. This difference corresponds to the dynamic consumption of the selected module due to the reduction in frequency of said at least one corresponding module clock signal.

Figure 2:
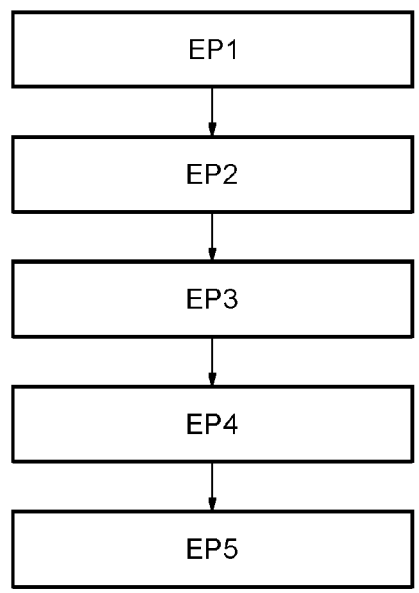
FIG. 2 schematically illustrates one example of a method for determining the dynamic consumption of a module within a device.

FIG. 2 schematically illustrates one example of a method for determining the dynamic consumption of a module within a device such as the system on chip SOC illustrated in FIG. 1.

Said process first of all includes a first step EP1 in which at least one module clock signal SHMi is delivered from said reference clock signal SHR to each functional module IPi.

In this first step EP1, no module is selected. The management means MG generates said control signal SC, and said activation signal SA both having a continuously low level. Each module IPi of said system SOC operates in its nominal mode. In other words, each corresponding processing component CTi delivers said at least one module clock signal SHMi having a nominal frequency to the associated module IPi in order to ensure the nominal operation of said associated module IPi.

The method switches over to a second step EP2 when the management means MG delivers the control signal SC for selecting via the means MSEL a module IPi whereof the dynamic consumption is to be measured. The control signal SC then takes a high state.

In this second step EP2, the pulse generator GI of the control means MC generates the pulse signal SI defining a measurement period by receiving the activation signal SA. The pulse signal SI is also delivered to said interface means MI, e.g. of the General Purpose Input Output type (GPIO).

The interface means MI then delivers the synchronization signal SSYN to the measurement means MM so as to synchronize said first measurement of the first consumption in said measurement period.

In response to the control signal SC and the pulse signal SI, the selection means MSEL delivers the corresponding selection signal SS1 to SS4 to each processing component CT1 to CT4. For example, if the component CTi is selected, then the signal SSi is the signal SI and the other signals SSj (j≠i) are then in the low state.

As will be seen below in more detail in the description, these selection signals SS1 to SS4 are intended to drive the corresponding processing components CT1 to CT4 so as to perform frequency reductions or even total frequency cut-offs on the module clock signals SHMi.

In order to minimize impacts on the performance of the system on chip SOC, a clock cut-off signal SCH is arranged within each processing component CTi and configured for controlling a total frequency cut-off when the module to be measured is capable of being completely deactivated or simply a frequency reduction of the selected module. The functionality of this clock cut-off signal SCH will be seen below in more detail.

Once module clock signals SHMi with reduced frequencies are delivered, the method switches over to a third step EP3 in which said first measurement of the first consumption of the system SOC is performed during said measurement period by said measurement means MM. This first consumption corresponds to a sum of a reduced consumption of said selected module IPi (due to said frequency reduction) and nominal consumptions of the other modules of the system SOC and optionally other structural components of the system SOC which are still active.

If a total frequency cut-off of the clock signal or signals of the selected module is ordered, then this first consumption corresponds to the dynamic consumption of the system on chip SOC without the contribution of the selected module.

A fourth step EP4 begins at the conclusion of the measurement period. The measurement means MM performs said second measurement of the second consumption of the system on chip SOC. This second consumption corresponds to the dynamic consumption of the system on chip SOC with all the modules IP1 to IP4 and all the other active structural components operating in a nominal way.

In a fifth step EP5 of said method, the calculation means MCAL calculates the difference between said first and the second consumption so as to determine the dynamic consumption of said selected module IPi.

If a total frequency cut-off is performed on the module clock signal or signals associated with said selected module IPi, said calculated difference corresponds directly to the dynamic consumption of the selected module IPi.

When a frequency reduction is performed on the module clock signal or signals associated with said selected module IPi, the calculation means MCAL performs a multiplication of said difference by a coefficient taking into account the frequency reduction factor so as to determine the dynamic consumption of said selected module IPi.

At the conclusion of the fourth and fifth steps EP4 and EP5 detailed above, said dynamic consumption of said selected module IPi may therefore be determined.

Thus, an accurate measurement may be made of the dynamic consumption of a module within a system on chip SOC so as to compare it with a preliminary estimate of this power and to validate said estimate.

Figure 3:
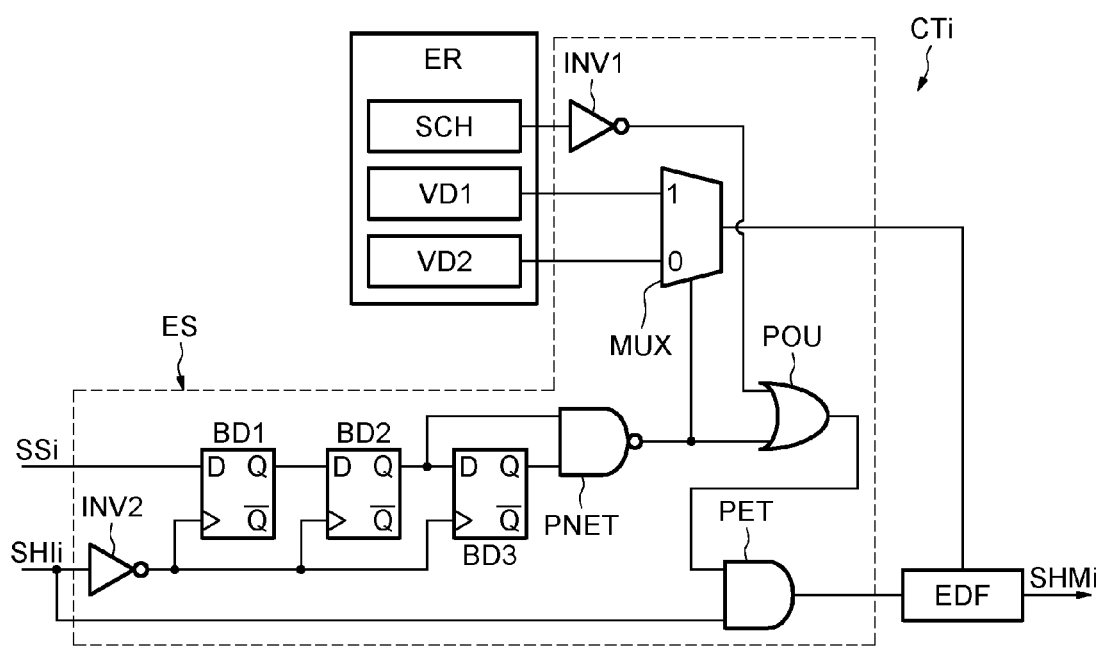
FIG. 3 illustrates in further detail an example of a processing component.

Reference is now made to FIG. 3 for illustrating in further detail an example of a processing component CTi.

The component CTi receives as input the selection signal SSi and the intermediate clock signal SHIi derived from the corresponding phase lock loop PLLi of the frequency modifying stage EMF.

The processing component CTi includes a register stage ER configured for storing: a first division value VD1 intended to be used for generating the module clock signal with a nominal frequency, a second division value VD2 intended to be used in the context of a frequency reduction for generating said module clock signal with a nominal frequency and an indication representative of the clock cut-off signal SCH.

The component CTi also includes: a selection stage ES configured for selecting the division value VD1 or VD2 according to the selection signal SSi, of the clock cut-off signal SCH and the intermediate clock signal SHIi, and a frequency divider stage EDF configured for generating said module clock signal SHMi according to the result from said selection stage ES.

When the selection signal SSi is in the high state, if the clock cut-off signal SCH is at the high level, the frequency divider stage EDF is blocked via a first inverter INV1, an OR gate POU, and an AND gate PET, and a total frequency cut-off is obtained on the module clock signal SHMi delivered to the selected module IPi.

If said clock cutoff signal SCH is at the low level, there is a switching of the state division value EDF between the value VD1 and the value VD2.

The selection stage ES includes, for example, three Type D flip-flops BD1 to BD3 coupled in series whereof the input of the first flip-flop BD1 is coupled to the corresponding selection signal SSi. The input and the output of the third flip-flop BD3 are respectively coupled to the two inputs of a NAND gate PNET. The clock signal of said three flip-flops BD1 to BD3 is derived from said corresponding intermediate clock signal SHIi via a second inverter INV2.

The selection stage ES further includes a multiplexer MUX having two inputs respectively intended to receive the first active division value VD1 and the second division value VD2 derived from the register stage ER. The output signal of said NAND gate PNET is coupled to the selection input of said multiplexer MUX so as to determine the choice between the first active division value VD1 and the second division value VD2.

When the corresponding selection signal SSi is in the high state, the output signal of said NAND gate PNET is in the low state. Consequently, the second division value VD2 is selected by said multiplexer MUX for driving the divider stage EDF and delivering said module clock signal from the SHMi with a reduced frequency. In the other cases, the first division value VD1 is selected and said active clock signal SHMi delivered comprises the nominal frequency of the associated module IPi.

As a non-restrictive guide, the second division value VD2 may be double the first active division value VD1.

Consequently, if the corresponding selection signal SSi is in the high state, the frequency of said module clock signal SHMi is half that of said module clock signal SHMi when the selection signal SSi is in the low state.

And, the consumption of said selected module IPi is then also reduced during the measurement period due to this reduction in frequency.

The invention claimed is:

1. A method for determining a consumption of a module within a device comprising multiple modules, comprising the following steps:
   delivering, from a reference clock signal, at least one module clock signal associated with each module;
   generating a measurement period;
   selecting a module for determining its consumption;
   reducing in frequency said at least one module clock signal associated with said selected module during said measurement period;
   measuring a first consumption of the device in said measurement period;
   measuring a second consumption of said device outside said measurement period; and
   determining the consumption of said selected module from the measured first and second consumptions.

2. The method according to claim 1, wherein generating the measurement period comprises generation, from an activation signal, a pulse signal defining said measurement period and generating a synchronization signal for synchronizing measurement of the first consumption in said measurement period.

3. The method according to claim 2, wherein selecting said module includes delivering, from a control signal and said pulse signal, at least one selection signal associated with each module and intended to determine said reduction in frequency.

4. The method according to claim 1, wherein reducing in frequency includes total frequency cut-off of said at least one module clock signal associated with said selected module during said measurement period.

5. The method according to claim 1, wherein determining the consumption includes calculating a difference between said first consumption and the second consumption.

6. The method according to claim 5, wherein determining the consumption further includes multiplying said difference by a coefficient taking into account the frequency reduction factor.

7. An electronic system, including:
   a device comprising multiple modules;
   a control circuit configured to generate a measurement period and select a module whose consumption is to be determined;
   a sequencing circuit configured to deliver, from a reference clock signal, at least one module clock signal associated with each module and perform a reduction in frequency of said at least one module clock signal associated with said selected module during said measurement period;
   a measurement circuit configured to perform a first measurement of a first consumption of said device in said measurement period and perform a second measurement of a second consumption of said device outside said measurement period; and
   a calculation circuit configured to determining the consumption of said selected module from the first and second measurements.

8. The system according to claim 7, wherein the control circuit includes:
   a management circuit configured to deliver a control signal and an activation signal, and
   a pulse generator that receives said activation signal and delivers a pulse signal defining said measurement period,
   said device further including an interface configured to receive said pulse signal and deliver a synchronization signal enabling the measurement circuit to synchronize the first measurement of the first consumption in said measurement period.

9. The system according to claim 8, wherein the control means further include a selection circuit configured to receive said control signal and said pulse signal and to output to said sequencing circuit at least one selection signal associated with each module.

10. The system according to claim 9, wherein the sequencing circuit comprises as many processing components as module clock signals, each processing component being coupled to a corresponding module to receive the corresponding selection signal originating from said control circuit and to deliver the module clock signal associated with said module.

11. The system according to claim 10, wherein the selection circuit is further configured to perform an automatic scan of the processing components so as to determine the dynamic consumption of each corresponding module.

12. The system according to claim 10, wherein the sequencing circuit is configured to perform a total frequency cut-off of said at least one module clock signal associated with said selected module during said measurement period.

13. The system according to claim 7, wherein the calculation circuit is configured to calculate a difference between the first consumption and the second consumption.

14. The system according to claim 13, wherein the calculation circuit is further configured to multiply said difference by a coefficient taking into account the frequency reduction factor.

* * * * *